(12) United States Patent
Nakasaka

(10) Patent No.: US 9,894,814 B2
(45) Date of Patent: Feb. 13, 2018

(54) ELECTRIC POWER CONVERTOR

(71) Applicant: DENSO CORPORATION, Kariya, Aichi-pref. (JP)

(72) Inventor: Akira Nakasaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/820,863

(22) Filed: Aug. 7, 2015

(65) Prior Publication Data
US 2016/0073556 A1 Mar. 10, 2016

(30) Foreign Application Priority Data

Aug. 7, 2014 (JP) ................................. 2014-161399

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01)

(58) Field of Classification Search
CPC . H01L 23/473; H01L 2924/181; H01L 35/30; H01L 23/4735; H05K 7/20927; H05K 7/20772; H05K 7/20236
See application file for complete search history.

(56) References Cited

U.S. PATENT DOCUMENTS

| 2006/0108098 | A1* | 5/2006 | Stevanovic ........... H01L 23/473 165/80.4 |
| 2006/0243422 | A1* | 11/2006 | Sakai ..................... H01L 23/473 165/80.4 |
| 2009/0250195 | A1* | 10/2009 | Yoshida .................... F28F 3/02 165/80.3 |
| 2010/0097765 | A1* | 4/2010 | Suzuki ................... B60K 6/365 361/699 |
| 2013/0021749 | A1* | 1/2013 | Nakajima ............. H02M 7/003 361/689 |
| 2014/0140034 | A1 | 5/2014 | Kusada et al. |
| 2014/0198449 | A1* | 7/2014 | Osada ................ H05K 7/20927 361/689 |
| 2015/0189790 | A1 | 7/2015 | Tachibana |
| 2015/0289411 | A1 | 10/2015 | Kamiya et al. |

FOREIGN PATENT DOCUMENTS

| JP | 2002315358 A | 10/2002 |
| JP | 2012-210022 A | 10/2012 |
| JP | 2014-103733 A | 6/2014 |
| JP | 2015-144544 A | 8/2015 |

* cited by examiner

Primary Examiner — Adam B Dravininkas
(74) Attorney, Agent, or Firm — Oliff PLC

(57) ABSTRACT

An electric power converter 10 includes a flow passage FP1 formed so that cooling water can pass through while exchanging heat with semiconductor modules 51, another flow passage FP2 formed so that the cooling water can pass through while exchanging heat with a capacitor 52 and a reactor 53, and a plate-like connecting plate 200 attached in a state where a major surface thereof is disposed along a side wall 110 of a case 100. A groove 211 and a groove 221 that communicate between the flow passage FP1 and the flow passage FP2 are formed in the connecting plate 200.

6 Claims, 17 Drawing Sheets

FIG.3
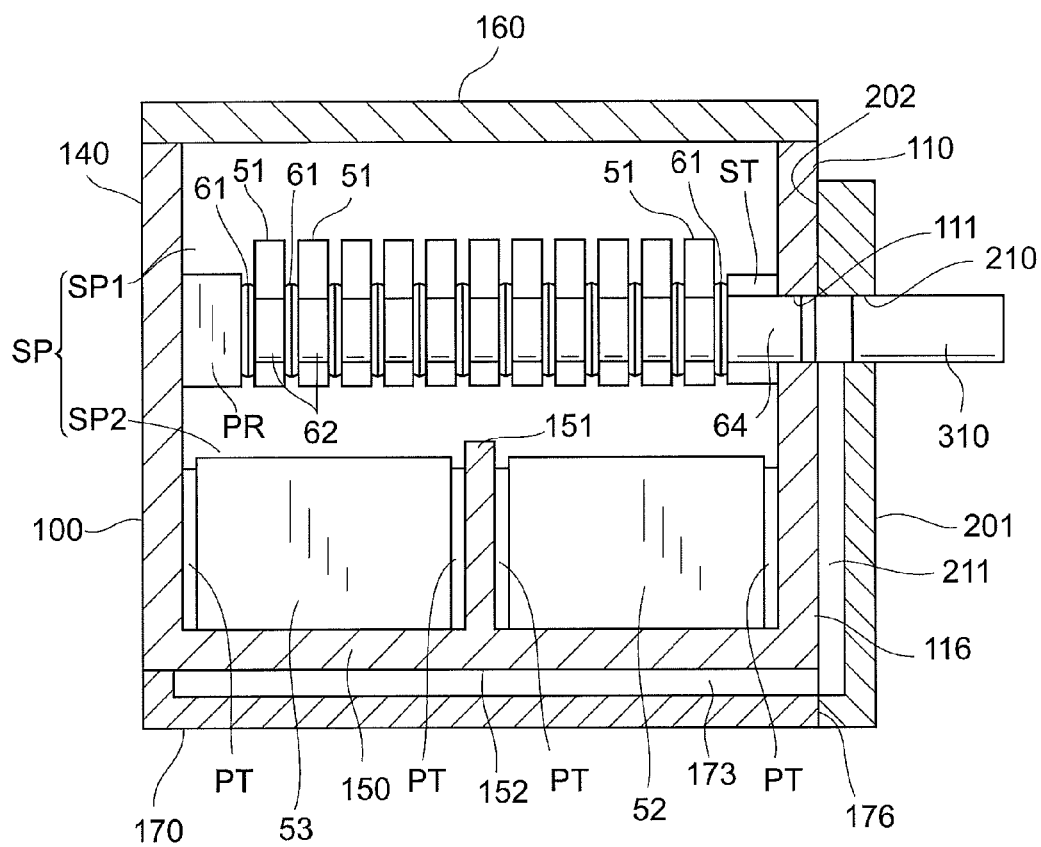
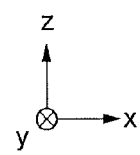

FIG.5
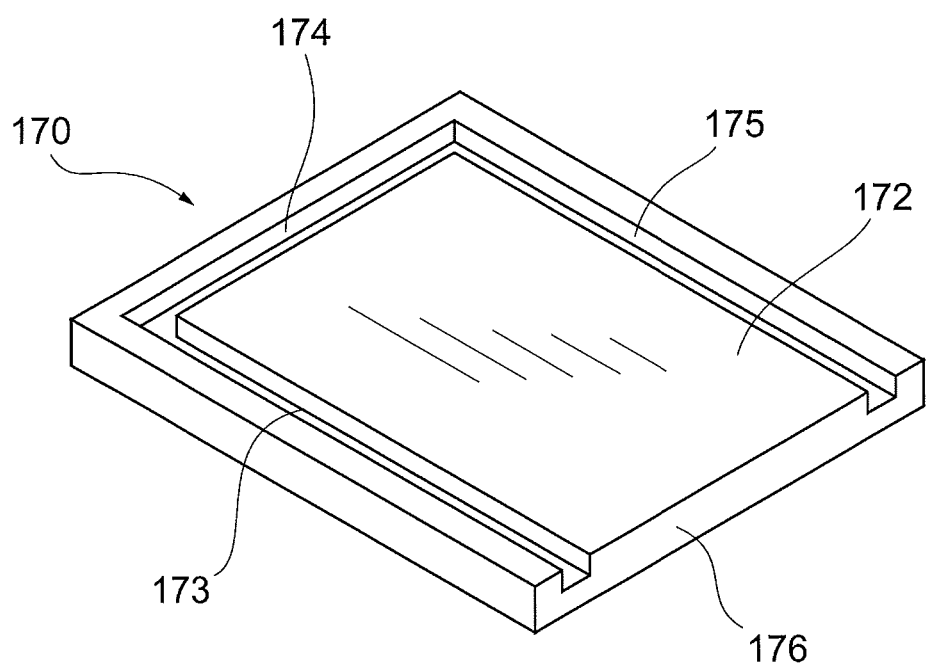
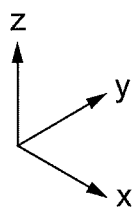

ELECTRIC POWER CONVERTOR

CROSS-REFERENCE TO RELATED APPLICATION

This application is based on and claims the benefit of priority from earlier Japanese Patent Applications No. 2014-161399 filed Aug. 7, 2014, the description of which is incorporated herein by reference.

TECHNICAL FIELD

The present invention relates to an electric power converter equipped with an electric power conversion circuit.

BACKGROUND

An electric power converter having an electric power conversion circuit such as a DC-DC converter or an inverter is mounted on an electric vehicle or a hybrid vehicle. Since such an electric power converter is for adjusting and controlling electric power for driving a motor of the electric vehicle, etc., the power handled by it is very large. Thus, there is a large amount of heat generated from components constituting the electric power conversion circuit (for example, a reactor, a capacitor, and etc.) during operation of the electric power converter. In order to operate the electric power converter stably, it is necessary to operate it while maintaining a proper temperature thereof by cooling the components of the electric power conversion circuit.

The electric power converter has a structure such that a plurality of components constituting the electric power conversion circuit (hereinafter, also referred to as circuit components) are housed inside the case. Further, cooling passages where fluid such as coolant or cooling water passes through are formed inside the case. The temperature of each circuit components is maintained at an appropriate temperature by heat being exchanged between the fluid supplied from the outside that passes through the cooling passages and the circuit components.

Since the electric power converter is disposed in a limited space of the electric vehicle, etc., it is required that overall form is compact. Therefore, it has become common that the electric power conversion circuit is not housed in a state where all the circuit components are aligned along a single horizontal plane in the case, but is housed in a state where the circuit components are divided into an upper space and a lower space in the case. As a result, the cooling passages for cooling the circuit components are also respectively formed on the upper space and the lower space in the case (refer to Japanese Patent Application Laid-Open Publication No. 2012-210022).

There are four tubes connected to the case from the outside for feeding and discharging the fluid into and out from the cooling passages in the electric power converter disclosed in the above Publication No. 2012-210022. That is, it has a structure that four tubes consisting (1) a tube for feeding the fluid from outside the case to the upper space cooling passages, (2) a tube for discharging the fluid outside of the case from the upper space cooling passages, (3) a tube for feeding the fluid from outside the case to the lower space cooling passage, and (4) a tube for discharging the fluid outside of the case from the lower space cooling passages are respectively protrude toward the outside from side surfaces of the case.

Furthermore, tubes for connecting the upper space cooling flow passages and the lower space cooling flow passages are disposed on the outside of the case. As a result, many other tubes are routed around the case, and these tubes would interfere with other devices that are disposed around the electric power converter. In other words, in a case where the conventional electric power converter is mounted on the electric vehicle, etc., routing of the plurality of tubes where the cooling fluid passes becomes extremely difficult in the conventional electric power converter disclosed in the Publication No. 2012-210022.

SUMMARY

The present invention has been made in light of the problems set forth above and has as its object to provide an electric power converter that suppresses interference between tubes where cooling fluid passes through and other devices while ensuring cooling performance for cooling an electric power conversion circuit.

An aspect of an electric power converter includes a case having a housing space formed therein, a first circuit section, which is a part of an electric power conversion circuit, disposed on an upper space of the housing space, a second circuit section, which is another part of the electric power converter circuit, disposed on a lower side of the housing space, a first flow passage formed so that a fluid passes through while exchanging heat with the first circuit section, a second flow passage formed so that a fluid passes through while exchanging heat with the second circuit section, and a plate-like connecting plate attached in a state where a major surface thereof is disposed along a side wall of the case. Connecting passages that communicate between the first flow passage and the second flow passage are formed in the connecting plate.

In the electric power converter of the present invention, the first flow passage and the second flow passage are not connected with each other by tubes disposed outside the case, but are communicated by the connecting passages formed in the plate-like connecting plate. A term "formed in the connecting plate" means that at least a part of the connecting passage is defined by the connecting plate. That is, a situation where the connecting passage is defined by grooves formed on the major surface of the connecting plate and the side walls of the case, and a situation that the connecting passage is defined by the grooves formed on the side walls of the case and the major surface of the connecting plate are included. In addition, a situation that the entire connecting passage is defined only by the connecting plate is also included.

In such a configuration, only a single feed tube for feeding a fluid into the case and a single discharge tube for discharging the fluid out of the case are required as the tubes disposed outside the case. In other words, the tubes projecting outwardly from the case need not be four, but two is sufficient.

Further, since a tube for connecting the first flow passage and the second flow passage flow does not need to be disposed outside the case, a possibility that other devices disposed around the electric power converter and the tubes where a cooling fluid passes through interfere each other becomes low. Therefore, routing of tubes around the electric power converter is facilitated as compared with the conventional technology.

According to the present invention, an electric power converter that suppresses tubes where cooling fluid passes through from interfering with other devices while ensuring cooling performance for cooling an electric power conversion circuit can be provided.

BRIEF DESCRIPTION OF THE DRAWINGS

FIG. 3 shows a schematic diagram of the internal configuration of the electric power converter shown in FIG. 1;

FIG. 5 shows a perspective view of a bottom plate of a case of the electric power converter shown in FIG. 1;

DETAILED DESCRIPTION OF THE PREFERRED EMBODIMENTS

Figure 1:
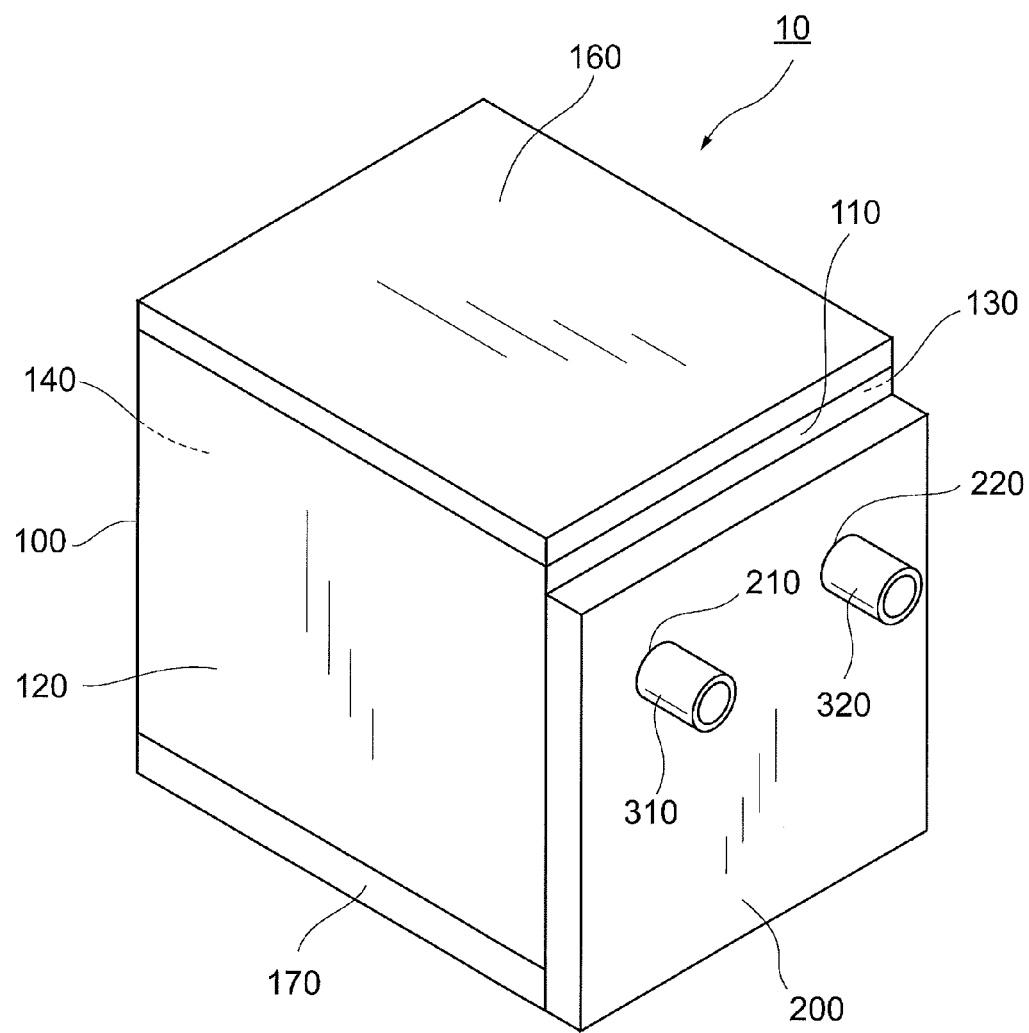
FIG. 1 shows a perspective view of an overall structure of an electric power converter according to a first embodiment of the present invention.

Embodiments of the present invention will be described with reference to the accompanying drawings. In order to facilitate understanding of the description, the same components are denoted by the same reference numerals in the drawings as far as possible, and redundant description will be omitted.

Figure 2:
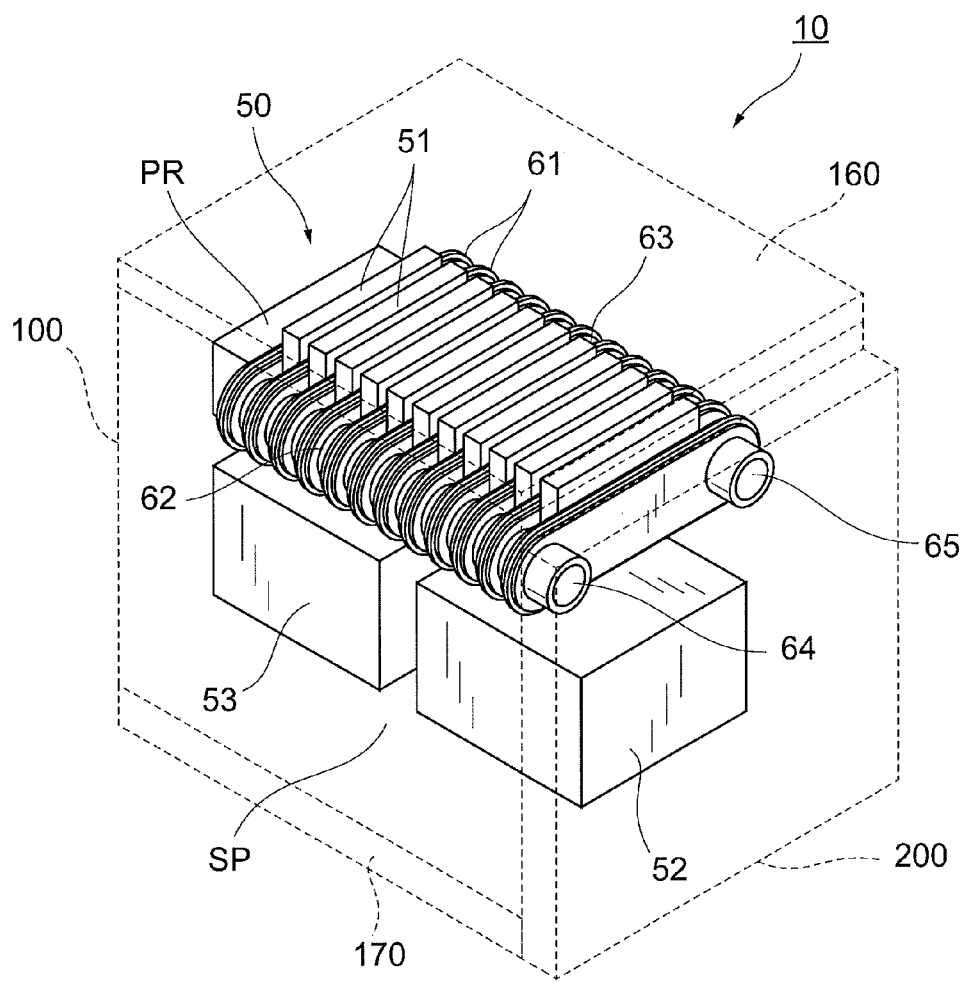
FIG. 2 shows a perspective view of an internal configuration of the electric power converter shown in FIG. 1.

As shown in FIGS. 1 to 3, an electric power converter according to a first embodiment of the present invention has a structure in which an electric power conversion circuit 50 is housed inside a case 100. The electric power converter 10 is an inverter apparatus for converting DC to AC, and is intended to be mounted on an electric vehicle, for example.

It should be noted that an x-axis is set to a direction as an +x direction that is a horizontal direction and is a direction where a feed tube 310 projects from a connecting plate 200 in FIG. 1. Moreover, a y-axis is set to a direction as a +y direction that is a horizontal direction and is perpendicular to the +x direction (a direction toward a discharge tube 320 from the feed tube 310 in FIG. 1). In addition, a z-axis is set to a direction as a +z direction towards vertically upward. In subsequent drawings, the x-axis, the y-axis, and the z-axis are set in a similar manner.

The case 100 is a rectangular container formed by aluminum, for example, and includes side walls 110, 120, 130, 140, a bottom wall 150 (refer to FIG. 3) a top cover 160, and a bottom cover 170. Among these, the side walls 110, 120, 130, 140, and the bottom wall 150 are formed integrally by die casting, for example.

The side wall 110 is a side wall disposed in the +x direction side, and a normal direction of its major surface is disposed along the x-axis. A first through hole 111 (refer to FIG. 3) that is an inlet of a cooling water supplied from the feed tube 310 and a second through hole (not shown) that is an outlet of cooling water discharged towards the discharge tube 320 are formed in the side wall 110. The first through hole 111 and the second through hole are holes formed in the same shape, and are formed so as to be aligned along the x-axis at a position at the same height (z-coordinate) as each other.

The side wall 120 is a side wall disposed in the −y direction side, and a normal direction of its major surface is disposed along the y-axis. An edge of the side wall 120 in the +x direction side is connected to an edge of the side wall 110 in the −y direction side.

The side wall 130 is a side wall disposed in the +y direction side, and a normal direction of its major surface is direction along the y-axis. An edge of the side wall 130 in the +x direction side is connected to an edge of the side wall 110 in the +y direction side.

The side wall 140 is a side wall disposed in the −x direction side, and a normal direction of its major surface is disposed along the x-axis. An edge of the side wall 140 in the −y direction side is connected to an edge of the side wall 120 in the −x direction side. In addition, an edge of the side wall 140 in the +y direction side is connected to an edge of the side wall 130 in the −x direction side.

The bottom wall 150 is a wall disposed in the −z direction side (bottom), and a normal direction of its major surface is disposed along the z-axis. An edge of the bottom wall 150 in the +x direction side is connected to a lower edge of the side wall 110. An edge of the bottom wall 150 in the −y direction side is connected to a lower edge of the side wall 120. An edge of the bottom wall 150 in the +y direction side is connected to a lower edge of the side wall 130. An edge of the bottom wall 150 in the −x direction side of the bottom wall 150 is connected to a lower edge of the side wall 140.

The top cover 160 is a rectangular plate disposed so as to close an internal space (a housing space) SP of the case 100 from above. The top cover 160 is fixed to upper edges of the side walls 110, 120, 130 and 140 by bolts (not shown) in a state where the top cover 160 is abutting these upper edges.

The bottom cover 170 is a rectangular plate having substantially the same shape as the bottom wall 150 when viewed from the top. The bottom cover 170 is fixed to the bottom wall 150 by bolts (not shown) in a state of abutting thereto from below.

The connecting plate 200 is disposed on the +x direction side of the case 100. The connecting plate 200 is a rectangular plate that is formed by aluminum, for example, similarly to the case 100. The connecting plate 200 is fixed to the case 100 by bolts (not shown) in a state in which its major surface is disposed along the side wall 110. A width of the connecting plate 200 in the +Y direction is equal to a width of the side wall 110 in the +y direction. A position of a lower edge of the connecting plate 200 coincides with a position of a lower edge of the bottom cover 170. In addition, an upper edge of the connecting plate 200 is in a position lower than an upper edge of the side wall 110. A first through hole 210 is formed in the connecting plate 200, and one end portion of the feed tube 310 is fixed by being inserted into the first through hole 210. Further, a second through hole 220 is formed in the connecting plate 200, and one end portion of the discharge tube 320 is fixed by being inserted into the second through hole 220. The specific shape and function of the connecting plate 200 will be described in detail later.

As shown in FIGS. 2 and 3, the electric power conversion circuit 50 is housed in the internal space SP of the case 100. The electric power conversion circuit 50 is an inverter circuit, and is constituted by a plurality of semiconductor modules 51 (a first circuit section), a capacitor 52 (a second circuit section), and a reactor 53 (a second circuit section). It should be noted that the electric power converter circuit is not limited to the inverter circuit as an embodiment of the present invention, but it may be a DC-DC converter circuit or other circuits.

Among the components constituting the electric power conversion circuit 50, the semiconductor modules 51 are housed in an upper side part of the internal space SP (hereinafter, also referred to as an upper space SP1). Further, the capacitor 52 and the reactor 53 are housed in a lower side part of the internal space SP (hereinafter, also referred to as a lower space SP2).

Among the electronic components constituting the electric power conversion circuit 50, the semiconductor module 51 is modularized by housing parts of the electronic components such as a switching element or a diode in a thin plate-like package. In the present embodiment, a total of 11 sheets of semiconductor modules 51 are provided on the electric power conversion circuit 50.

A plurality of flat cooling tubes 61 for cooling the semiconductor modules 51 is disposed in the upper space SP1. The flat cooling tubes 61 are tubes with flat shapes to which passages where the cooling water passes through are formed therein, and are disposed so as to be aligned along the +x direction at a distance from one another. Each of the flat cooling tubes 61 is disposed so that a normal direction of its major surface is disposed along the x-axis. A single semiconductor module 51 is sandwiched between the adjoining flat cooling tubes 61.

In addition, a first connecting tube 62 and a second connecting tube 63 are disposed between the adjoining flat cooling tubes 61. These connecting tubes are tubes having circular cross-sections, and a direction of the flow passage formed inside is along the x-axis. The first connecting tubes 62 are disposed near ends in the −y direction of the flat cooling tubes 61 (positions outside the semiconductor modules 51 in the +y direction), and the second connecting tubes 63 are disposed near ends in the +y direction side of the flat cooling tubes 61 (positions more +y direction side than the semiconductor modules 51 are). Each of central axes of all the first connecting tubes 62 coincides with each other. Similarly, each of central axes of all the second connecting tubes 63 coincides with each other.

The flow passages formed inside the flat cooling tubes communicate with internal spaces of the first connecting tubes 62 and the second connecting tubes 63 connected to the flat cooling tubes 61. That is, each of the flow passages of the flat cooling tube 61 is communicated with each other by the first connecting tube 62 and the second connecting tube 63.

First and second end connecting tubes 64 and 65 are connected to a flat cooling tube 61, which is disposed in the most +x direction side among the plurality of flat cooling tubes 61, so as to project toward the +x direction side from a major surface in the +x direction side thereof.

The first end connecting tube 64 is a tube having substantially the same shape as the first connecting tube 62, and a central axis thereof coincides with a central axis of the first connecting tube 62. One end portion of the first end connecting tube 64 is connected to the flat cooling tubes 61, and the other end is inserted into the first through hole 111 formed in the side wall 110. The end portion of the first end connecting tube 64 in the +x direction side is positioned inside the first through hole 111. Between an outer surface of the first end connecting tube 64 and an inner surface of the first through hole 111 are sealed watertight. An internal space (a flow passage) of the first end connecting tube 64 is communicated with the flow passages formed inside the flat cooling tubes 61.

Similarly, the second end connecting tube 65 is a tube having substantially the same shape as the second connecting tube 63, and a central axis thereof coincides with a central axis of the second connecting tube 63. One end portion of the second end connecting tube 65 is connected to the flat cooling tubes 61, and the other end is inserted into the second through hole formed in the side wall 110. The end portion of the second end connecting tube 65 in the +x direction side is positioned inside the second through hole. Between an outer surface of the second end connecting tube 65 and an inner surface of the second through hole are sealed watertight. An internal space (a flow passage) of the second end connecting tube 65 is communicated with the flow passages formed inside the flat cooling tubes 61.

A spacer ST, which is a rectangular-shaped block, is disposed between the first end connecting tube 64 and the second end connecting tube 65 (refer to FIG. 3). An end portion of the spacer ST in the +x direction side is in contact with the side wall 110. Another end portion of the spacer ST in the −x direction side is in contact with the flat cooling tube 61 (which is disposed in the most +x direction side).

A pressing member PR is disposed between the flat cooling tube 61 disposed on the most −x direction side and the side wall 140. A pressing member PR is a leaf spring, for example, disposed in a compressed state along the x-axis, one end thereof is in contact with the side wall 140 and another end thereof is in contact with the flat cooling tube 61 (which is disposed in the most −x direction side). With such a configuration, all the semiconductor modules 51 and flat cooling tubes 61 are compressed along the x-axis by restoring force of the pressing member PR in a state of being sandwiched between the pressing member PR and the spacer ST. Therefore, adhesion between the semiconductor modules 51 and the flat cooling tubes 61 is secured.

The capacitor 52 is disposed on an +x direction side portion of an upper surface of the bottom wall 150. In addition, the reactor 53 is disposed on a −x direction side portion of the upper surface of the bottom wall 150. A partition wall 151 extending upwardly from the bottom wall 150 is disposed between the capacitor 52 and the reactor 53. The partition wall 151 is a plate-like wall parallel to the side wall 110 and the side wall 140. The partition wall 151 is made of aluminum, for example, and is formed integrally with the side wall 110, the side wall 120, the side wall 130, the side wall 140, and the bottom wall 150 by die casting, for example. An edge of the partition wall 151 in the −y direction side is connected to the side wall 120, and an edge in the +y direction side is connected to the side wall 130. An upper edge of the partition wall 151 is positioned lower than lower edges of the semiconductor modules 51 and higher than either of an upper end portion of the reactor 53 and an upper end portion of the capacitor 52.

The capacitor 52 is in a state where a periphery thereof is filled with potting resin PT after being placed in a space defined by the side wall 110, the side wall 120, the side wall 130, the partition wall 151, and the bottom wall 150. In other words, the capacitor 52 is fixed in a state where the potting resin PT is interposed between inner wall surfaces of the case 100.

The reactor 53 is in a state where a periphery thereof is filled with potting resin PT after being placed in a space defined by the side wall 140, the side wall 120, the side wall 130, the partition wall 151, and the bottom wall 150. In other words, similarly to the capacitor 52, the reactor 53 is fixed in a state where the potting resin PT is interposed between inner walls of the case 100.

Any of the semiconductor modules 51, the capacitor 52, and the reactor 53 described above generates heat by a current flow during an operation of the electric power converter 10. Therefore, the flow passages where the cooling water for cooling the electric power converter 10 pass through are formed inside of the electric power converter 10.

First, a flow passage where the cooling water passes through in order to cool the semiconductor modules 51 (hereinafter, the flow passage is also referred to as a flow passage FP1) will be described. The flow passage FP1 is a flow passage composed of the first end connecting tube 64, the second end connecting tube 65, the first connecting tubes 62, the second connecting tubes 63, and the plurality of flat cooling tubes 61. After being supplied from the first end connecting tube 64, the cooling water passing through the flow passage FP1 flows through each of the first connecting tubes 62 in sequence toward the −x direction (arrow A2 in FIG. 4), and is supplied to a flow passage of each flat cooling tube 61.

The cooling water flows toward the +y direction (arrows A3 in FIG. 4) in the flow passage of each of the flat cooling tube 61. At this time, heat exchange is performed between the cooling water and the semiconductor modules 51 through walls of the flat cooling tubes 61. The cooling water raises its temperature gradually by the heat from the semiconductor modules 51 while flowing toward the +y direction in the flow passages of the flat cooling tubes 61. Then, the cooling water flows toward the +x direction (the arrow A4 in FIG. 4) in each of the second connecting tube 63, and is discharged from the second end connecting tube 65.

Next, a flow passage where the cooling water passes through in order to cool the capacitor 52 and the reactor 53 (hereinafter, the flow passage is also referred to as a flow passage FP2) will be described. As shown in FIG. 5, grooves 173, 174, 175 are formed on an upper surface 172 of the bottom cover 170. The groove 173 is a groove formed so as to extend toward the −x direction from an edge in the +x direction side on the −y direction side portion of the top surface 172. The groove 175 is a groove formed so as to extend toward the −x direction from an edge in the +x direction side on the +y direction side portion of the top surface 172. The groove 173 and the groove 175 are grooves that are parallel with each other and have the same shape. The groove 174 is a groove formed extending along the y-axis so as to connect an end portion of the groove 173 in the −x direction side and an end portion of the groove 175 in the −x direction side. A shape of a bracket ([) is formed by the grooves 173, 174, 175.

In the present embodiment, the groove 173 is formed in a position vertically below the first connecting tube 62. Therefore, a y coordinate of a central axis of the groove 173 is the same as a y coordinate of a central axis of the first end connecting tube 64 (and the first through hole 111). In addition, the groove 175 is formed in a position vertically below the second connecting tube 63. Therefore, a y coordinate of the central axis of the groove 175 is the same as a y coordinate of a central axis of the second end connecting tube 65 (and the second through hole).

The flow passage FP2 is formed by a bracket-shaped space defined by the wall surfaces that define the grooves 173, 174, 175 and a lower surface 152 of the bottom wall 150. After flowing into the groove 173 from an end in of +x direction side, the cooling water passes through the grooves 173, 174, 175 in this order (arrows A21, A22, A23 in FIG. 4), and flows out from an end portion of the groove 175 in the +x direction side. Meanwhile, the heat exchange between the cooling water passing through the flow passage FP2 and the capacitor 52 and the reactor 53 is performed through the bottom wall 150. The cooling water raises its temperature gradually by the heat from the capacitor 52 and the reactor 53 while flowing through the grooves 173, 174, 175 in this order.

Next, a configuration for feeding (and discharging) the cooling water to (and from) the flow passage FP1 and the flow passage FP2 will be described. First, referring mainly to FIG. 6, a description will be given for a specific shape of the connecting plate 200.

The first through hole 210 of the connecting plate 200 is formed in a position corresponding to the first through hole 111 of the side wall 110. In other words, a central axis of the first through hole 210 coincides with a central axis of the first through hole 111. Similarly, the second through hole 220 of the connecting plate 200 is formed at a position corresponding to the second through hole of the side wall 110. In other words, the a central axis of the second through hole 220 coincides with a central axis of the second through hole of the side wall 110.

Two grooves (a groove 211, a groove 221) extending along the z-axis are formed in a major surface in the −x direction side of the connecting plate 200, that is, a surface 202 that contacts with the side wall 110. An upper end portion of the groove 211 is communicated with the first through hole 210. A lower end portion of the groove 211 has a position higher than a lower edge of the connecting plate 200. Similarly, an upper end portion of the groove 221 is communicated with the second through hole 220. A lower end portion of the groove 221 is in a position higher than a lower edge of the connecting plate 200, and is the same height as the lower end portion of the groove 211.

As shown in FIG. 3, a surface 116 in the +x direction side of the side wall 110 and a surface 176 in the +x direction side of the bottom cover 170 are positioned on the same plane. The connecting plate 200 is fixed in a state where the surface 202 is brought into contact with both of these surface 116 and the surface 176.

In this state, the lower end portion of the groove 211 is positioned at the same height as a bottom of the groove 173 formed in the bottom cover 170. Further, a y-coordinate of a central axis of the groove 211 coincides with the y-coordinate of the central axis of the groove 173. Therefore, an internal space of the groove 211 is connected to an internal space of the groove 173 at its lower end.

Similarly, the lower end portion of the groove 221 is positioned at the same height as a bottom of the groove 175 formed in the bottom cover 170. Further, a y-coordinate of a central axis of the groove 221 coincides with the y-coordinate of the central axis of the groove 175. Therefore, an internal space of the groove 221 is connected to an internal space of the groove 175 at its lower end.

As shown in FIG. 3, the feed tube 310 is fixed in a state where a portion near an end thereof in the −x direction side is inserted into the first through hole 210. Between an outer surface of the feed tube 310 and an inner surface of the first through hole 210 are sealed watertight. In addition, the end portion of the feed tube 310 in the −x direction side is positioned more in the +x direction side than a bottom surface (an inner surface of which a normal line is along the x-axis) of the groove 211 is. Hence, the upper end portion of the groove 211 is not blocked by the feed tube 310. An internal space of the feed tube 310 is communicated with an internal space of the groove 211.

It is similar to the discharge tube 320 that the discharge tube 320 is fixed in a state where a portion near an end thereof in the −x direction side is inserted into the second through hole 220. Between an outer surface of the discharge tube 320 and an inner surface of the second through hole 220 are sealed watertight. In addition, the end portion of the discharge tube 320 in the −x direction side is positioned more in the +x direction side than a bottom surface (an inner surface of which a normal line is along the x-axis) of the groove 221 is. Hence, the upper end portion of the groove 211 is not blocked by the discharge tube 320. An internal space of the discharge tube 320 is communicated with an internal space of the groove 221.

Figure 4:
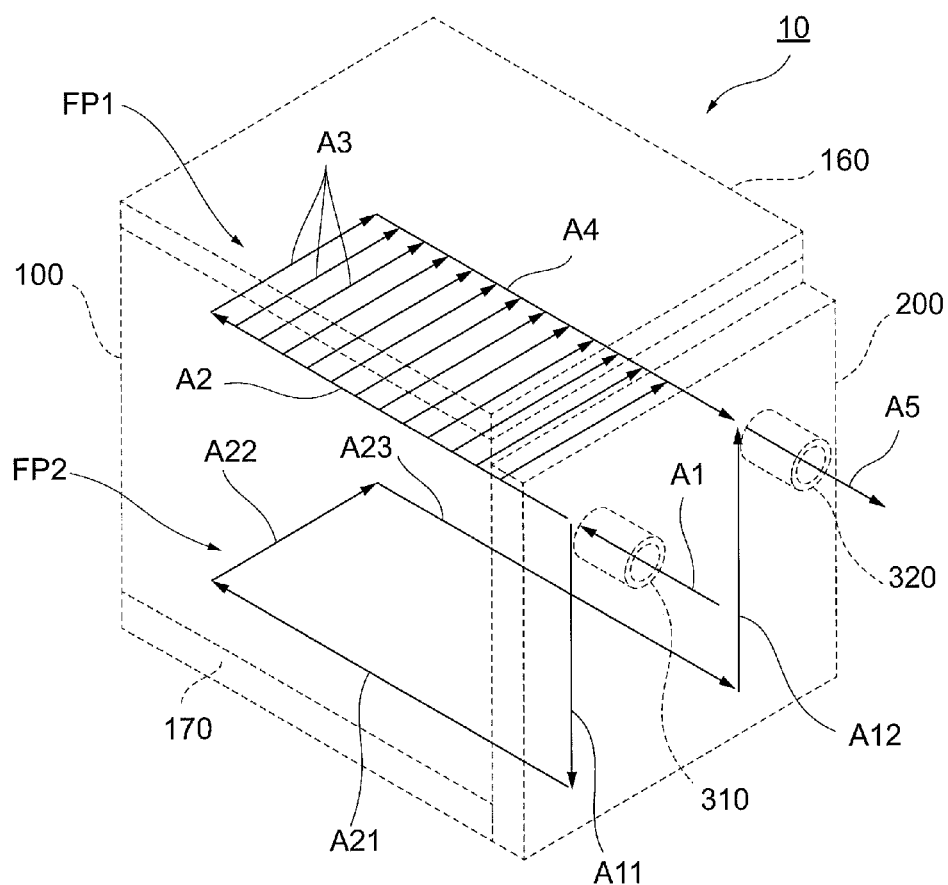
FIG. 4 shows a diagram of a flow of cooling water in the electric power converter shown in FIG. 1.

The cooling water supplied from an external radiator (not shown) first flows in the feed tube 310 toward the −x direction, and flows into a space between the feed tube 310 and the first end connecting tube 64 (arrow A1 of FIG. 4). Then, a part of the cooling water flows directly into the first end connecting tube 64, absorbs the heat of the semiconductor modules 51 while passing through the flow passage FP1 as already described, and reaches a space between the discharge tube 320 and the second end connecting tube 65. Then, the cooling water returns to the radiator flowing in the discharge tube 320 toward the +x direction (the arrow A5 in FIG. 4).

A remainder of the cooling water flowing into the space between the feed tube 310 and the first end connecting tube 64 flows downwardly in the grooves 211 (arrow A11 in FIG. 4), and reaches the end portion of the groove 173 in the +x direction side. In other words, it reaches to an inlet portion of the flow passage FP2. Then, as already described, the cooling water absorbs the heat of the capacitor 52 and the reactor 53 while passing through the flow passage FP2, and reaches the end portion of the groove 175 in the +x direction side. Thereafter, the cooling water is flowing toward the groove 221 upwardly (arrow A12 in FIG. 4), flows into the space between the discharge tube 320 and the second end connecting tube 65, and merges with the cooling water that has passed through the flow passage FP1. Eventually, the cooling water flows in the discharge tube 320 toward the +x direction together with the cooling water passing through the flow passage FP1 and returns to the radiator (arrow A5 in FIG. 4).

As described above, in the electric power converter 10 according to the present embodiment, the plurality of semiconductor modules 51 are disposed in the upper space SP1 of the internal space SP of the case 100, while the capacitor 52 and the reactor 53 are disposed in the lower space SP2. In addition, the flow passage FP1 that is a flow passage for cooling the semiconductor module 51, and the flow passage FP2 that is a flow passage for cooling the capacitor 52 and the reactor 53 are formed in the electric power converter 10. The electric power converter 10 further includes a plate-like connecting plate 200 that is attached in a state where the major surface thereof is disposed along the side wall 110 of the case 100, and the groove 211 and the groove 221 are formed as passages (connecting passages) that communicate between the flow passage FP1 and the flow passage FP2 in the connecting plate 200.

With such a configuration, even the electric power converter 10 has a structure where there are 2 systems of flow passages where the cooling water pass (the flow passage FP1, the flow passage FP2) formed, there are only two pipings (not four) for the cooling water connected.

Furthermore, since the flow passage FP1 and the flow passage FP2 are formed in the plate-like connecting plate 200, it is not necessary to dispose the piping for connecting the two around the electric power converter 10. Therefore, a possibility that other components and the piping interfere with each other at the periphery of the electric power converter 10 (in particular, the +x direction side of the side wall 110) is small, and routing of tubes has become easier than before.

In the present embodiment, the side wall 110 is also cooled by the cooling water passing through the groove 211, and by the cooling water passing through the groove 221. Therefore, the capacitor 52 that is fixed only via the potting resin PT between the side wall 110 is also cooled by the side wall 110. In other words, in addition to the heat exchange between the cooling water passing through the flow passage FP2 and the capacitor 52 being performed through the bottom wall 150, the heat exchange between the cooling water passing through the grooves 211, 221 and the capacitor 52 through the side wall 110 is also performed. As a result, the capacitor 52 is cooled at a high cooling efficiency.

Moreover, the reactor 53 is cooled only by the heat exchange with the cooling water passing through the flow passage FP2 as described previously. However, since the reactor 53 is surrounded by the walls (the side wall 140, the side wall 120, the side wall 130, the partition wall 151, and bottom wall 150) made of aluminum that is a metal having a high thermal conductivity, and between these walls and the reactor 53 are filled with the potting resin PT, the reactor 53 is also cooled at a relatively high cooling efficiency.

Figure 7:
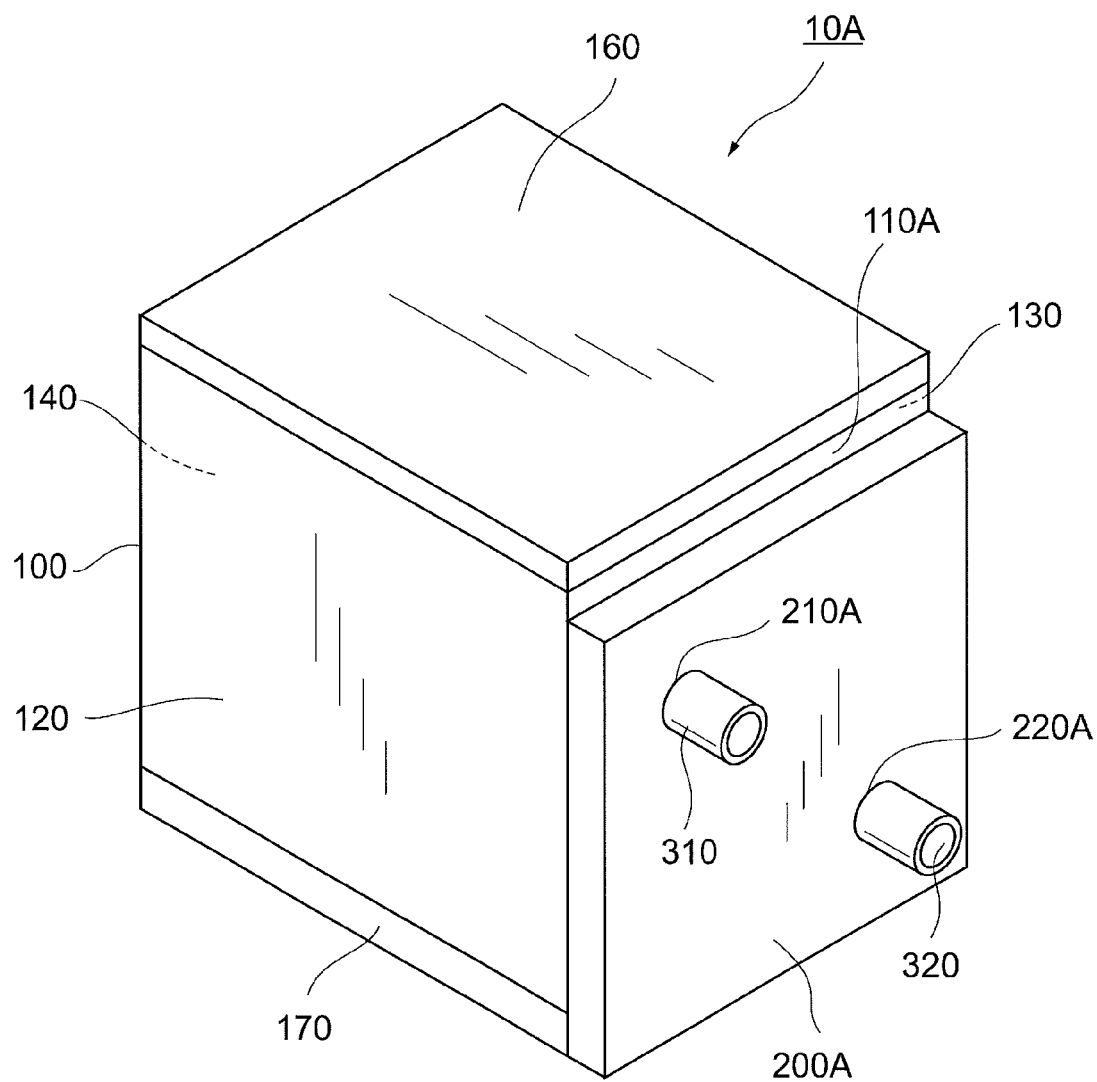
FIG. 7 shows a perspective view of an overall structure of an electric power converter according to a second embodiment of the present invention.

Next, an electric power converter 10A according to a second embodiment of the present invention will be described with reference to FIGS. 7-9. Although the electric power converter 10A is different from the electric power converter 10 in a shape of a side wall 110A, a shape of a connecting plate 200A, and a position of a discharge tube 320 connected to the connecting plate 200A, other configurations are the same as the electric power converter 10.

A second through hole 220A of the connecting plate 200A is formed in a position so as a central axis thereof substantially coincides with a central axis of the groove 175. Similarly to the side wall 110, a first through hole 111A (not shown) and a second through hole 220A (not shown) are formed in the side wall 110A. In addition to these, a through hole 113A (not shown) is formed on a position between the groove 175 and the second through hole 220A. The through hole 113A is a through hole having the same shape as the first through hole 111A and the second through hole 220A, and a central axis thereof coincides with a central axis of the second through hole 220A.

Figure 8:
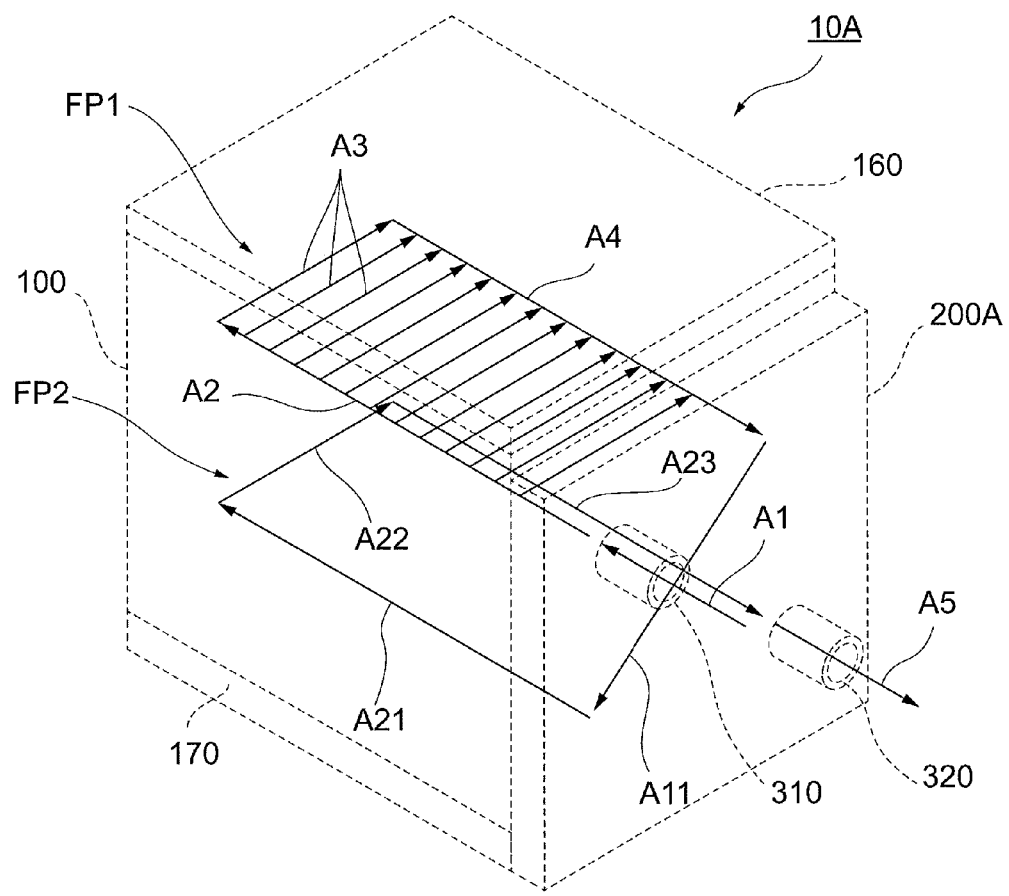
FIG. 8 shows a diagram of a flow of cooling water in the electric power converter shown in FIG. 7

Therefore, the cooling water after passing through the flow passage FP2 passes through directly straight from the groove 175 (arrow A23 in FIG. 8) to the through hole 113A and the second through hole 220A, and returns to the radiator flowing in the discharge tube 320 toward the +x direction (arrow A5 in FIG. 8).

Figure 9:
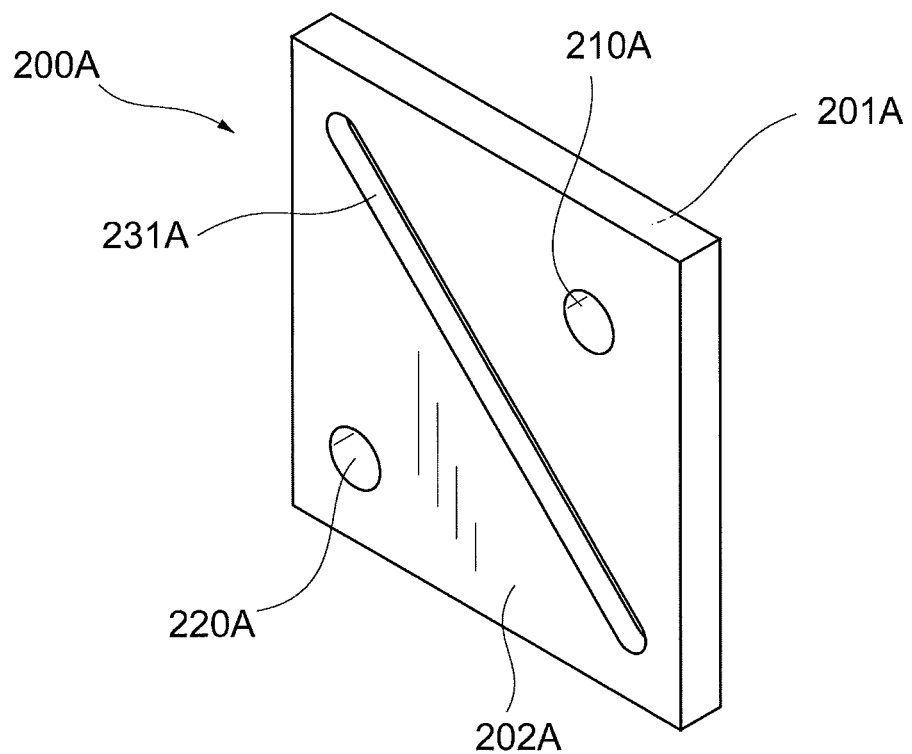
FIG. 9 shows a perspective view of a connecting plate of the electric power converter shown in FIG. 7.

As shown in FIG. 9, the groove 211 and the groove 221 are not formed on a major surface of the connecting plate 200A in the −x direction side, that is, a surface 202A that is a surface in contact with the wall 110A, and instead, a groove 231A is formed. The groove 231A is formed so as to extend obliquely substantially along a diagonal of the major surface of the connecting plate 200A. An upper end portion of the groove 231A is a position that is an upper side of the second through hole 220A, and is a position where a central axis of the second end connecting tube 65 passes. A lower end of the groove 231A is a position that is a lower side of the first through hole 210A, and is a position where a central axis of the groove 173 passes. Therefore, the flow passage FP1 and the flow passage FP2 are communicated by the groove 231A.

With such a configuration, the cooling water that has passed through the flow passage FP1 flows in the groove 231A toward obliquely downward after reaching the upper end portion of the grooves 231A via the second through hole A (arrow A11 in FIG. 8). Then, the cooling water reaches an end portion in the +x direction side of the groove 173, and it is to pass through the flow passage FP2.

In the electric power converter 10 according to the first embodiment, the flow passage FP1 and the flow passage FP2 are connected in parallel by the connecting plates 200 (refer to FIG. 4). In contrast, in the electric power converter 10A according the present embodiment, the flow passage FP1 and the flow passage FP2 are connected in series (refer to FIG. 8). Thus, by the routing of the groove formed on the surface 202A of the connecting plate 200A, connecting ways of the flow passage FP1 and the flow passage FP2 I can be set freely.

Figure 10:
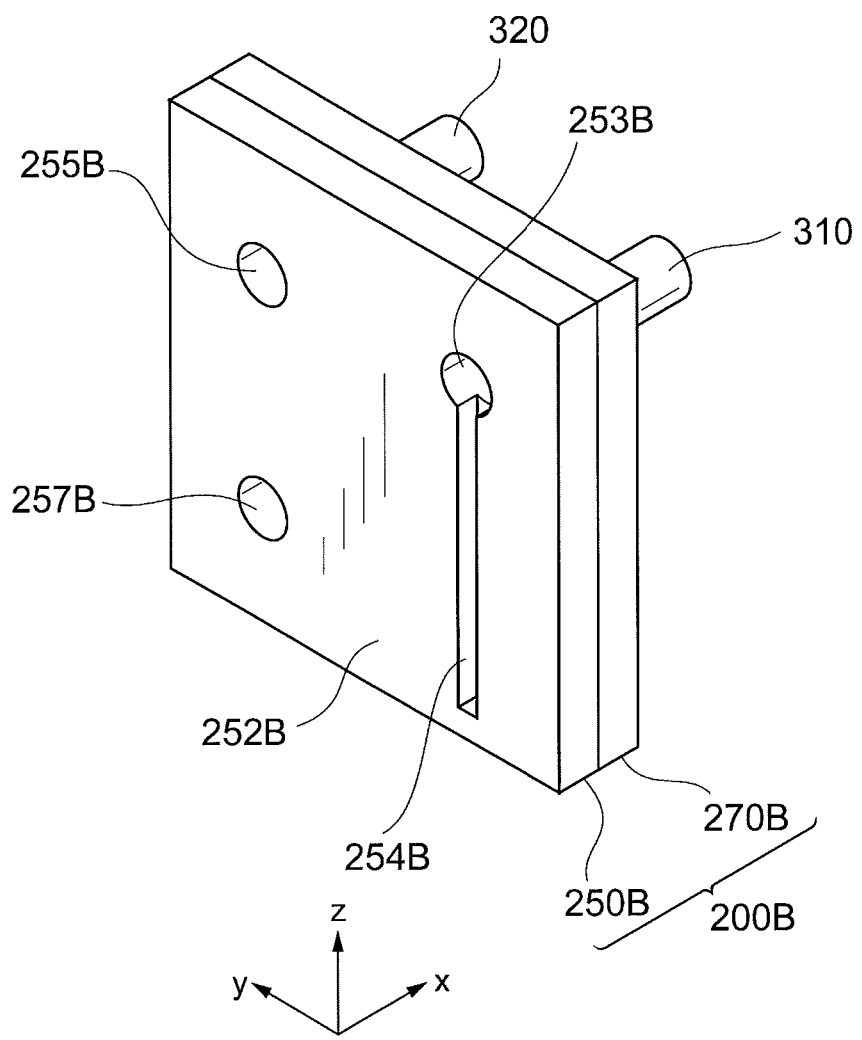
FIG. 10 shows a perspective view of a connecting plate of an electric power converter according to a third embodiment of the present invention.
Figure 11:
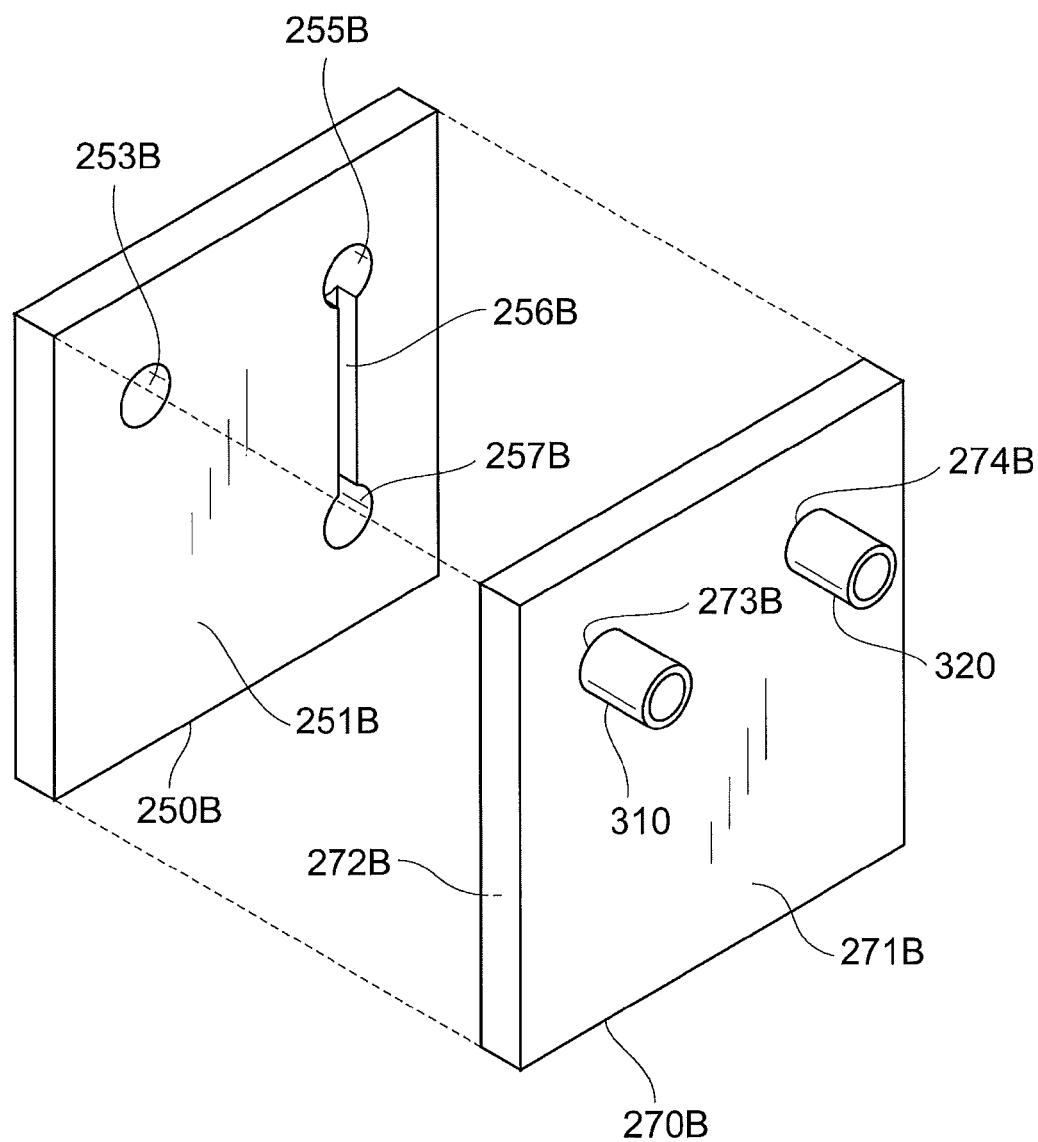
FIG. 11 shows an exploded view of the electric power converter according to the third embodiment of the present invention for describing a configuration of the connecting plate.

Next, an electric power converter 10B according to a third embodiment of the present invention will be described with reference to FIGS. 10 and 11. Although the electric power converter 10B is different from the electric power converter 10 in the shape of a connecting plate 200B, other configurations are the same as the electric power converter 10.

The connecting plate 200B is provided with a first connecting plate 250B and a second connecting plate 270B, and it has a structure that they are overlapped so as major surfaces thereof to contact each other.

The first connecting plate 250B is a plate disposed on the case 100 side. The first connecting plate 250B is fixed in a state where a surface 252B, which is a major surface thereof in the −x direction side, is abutted against the side wall 110. A surface 251B, which is a major surface of the first connecting plate 250B in the +x direction side, is a surface where the second connecting plate 270B abuts.

The second connecting plate 270B is fixed in a state where a surface 272B, which is a major surface thereof in the −x direction side, is abutted against the surface 251B of the first connecting plate 250B. The feed tube 310 and the discharge tube 320 are protruded toward the +x direction from a surface 271B which is a major surface of the second connecting plate 270B in the +x direction side.

A through hole 273B into which the feed tube 310 is inserted and a through hole 274B into which the discharge tube 320 is inserted are formed in the second connecting plate 270B. Between an outer surface of the feed tube 310 and an inner surface of the through hole 273B are sealed watertight. Further, between an outer surface of the discharge tube 320 and an inner surface of the through hole 274B are sealed watertight.

A position where the through hole 273B is formed is the same as a position where the first through hole 210 is formed in the connecting plate 200 when viewed along the x-axis. Moreover, a position where the through hole 274B is formed is the same as a position where the second through hole 220 is formed in the connecting plate 200. Thus, the feed tube 310 and the discharge tube 320 in the present embodiment are disposed in the same position with the feed tube 310 and discharge tube 320 in the electric power converter 10, respectively.

A through holes 253B, a through holes 255B, and a through hole 257B are formed in the first connecting plate 250B. The through hole 253B is formed in a position so as a central axis thereof substantially coincides with a central axis of the through hole 273B. The central axis of the through hole 253B also coincides with a central axis of the first end connecting tube 64. Through holes 255B is formed in a position so as a central axis thereof substantially coincides with a central axis of the through hole 274B. The central axis of the through hole 253B also coincides with a central axis of the second end connecting tube 65.

A groove 254B extending along the z-axis is formed on the surface 252B of the first connecting plate 250B. An upper end portion of the groove 254B is communicated with the through hole 253B. A lower end of the groove 254B is in a position higher than a lower edge of the connecting plate 200B, and is positioned in the same height as a bottom of the groove 173 formed in the bottom cover 170. A shape of the groove 254B is the same as a shape of the groove 211 (refer to FIG. 6) formed in the connecting plate 200 of the electric power converter 10.

A groove 256B extending along the z-axis is formed on the surface 251B of the first connecting plate 250B. An upper end portion of the groove 256B is communicated with the through hole 255B, and a lower end of the groove 256B is communicated with the through hole 257B.

In the electric power converter 10B, a part of the cooling water supplied from the feed tube 310 is supplied to the flow passage FP1 through the first end connecting tube 64 after passing through the through hole 273B and the through hole 253B. The cooling water that has passed through the flow passage FP1 passes through the through hole 255B and the through hole 274B, and returns to the radiator through the discharge tube 320.

The remainder of the cooling water that has passed through the through hole 253B flows downwardly in the groove 254B and reaches an end portion of the groove 173 in the +x direction side, and is supplied to the flow passage FP2.

The cooling water that has passed through the flow passage FP2 passes through the through hole 257B, and flows upwardly in the groove 256B. Then, it merges with the cooling water that has passed through the flow passage FP1, and returns to the radiator through the discharge tube 320.

As described above, in the present embodiment, the groove 254B that is a flow passage where the cooling water passes through toward the flow passage FP2, and the groove 256B that is a flow passage where the cooling water has passed through the flow passage FP2 (after absorbing heat from the capacitor 52 and the reactor 53) are formed on the connecting plate 200B. The temperature of the cooling water passing through the groove 256B is higher than the temperature of the cooling water passing through the groove 254 due to the heat from the capacitor 52 and the reactor 53.

In the present embodiment, the grooves 256B in which the cooling water with the high-temperature passes through is formed on a position farther than the groove 254B is as viewed from the case 100 side (that is, the position in the +x direction side). According to such a configuration, the heat from the hot cooling water that passes through the groove 256B is suppressed from returning to the electric power conversion circuit 50 housed in the case 100.

When both the flow passage where the water passes through toward the flow passage FP1 (referred to as a first flow passage) and the flow passage where the water has passed through the flow passage FP1 (referred to as a second flow passage) are formed in the connecting plate 200B, the second flow passage should be formed in a position in the +x direction side than the first flow passage is. That is, when a plurality of the flow passages of the cooling water are formed in the connecting plate 200B, a passage where the hot cooling water flows should be formed in a position in the more +x direction side.

Figure 12:
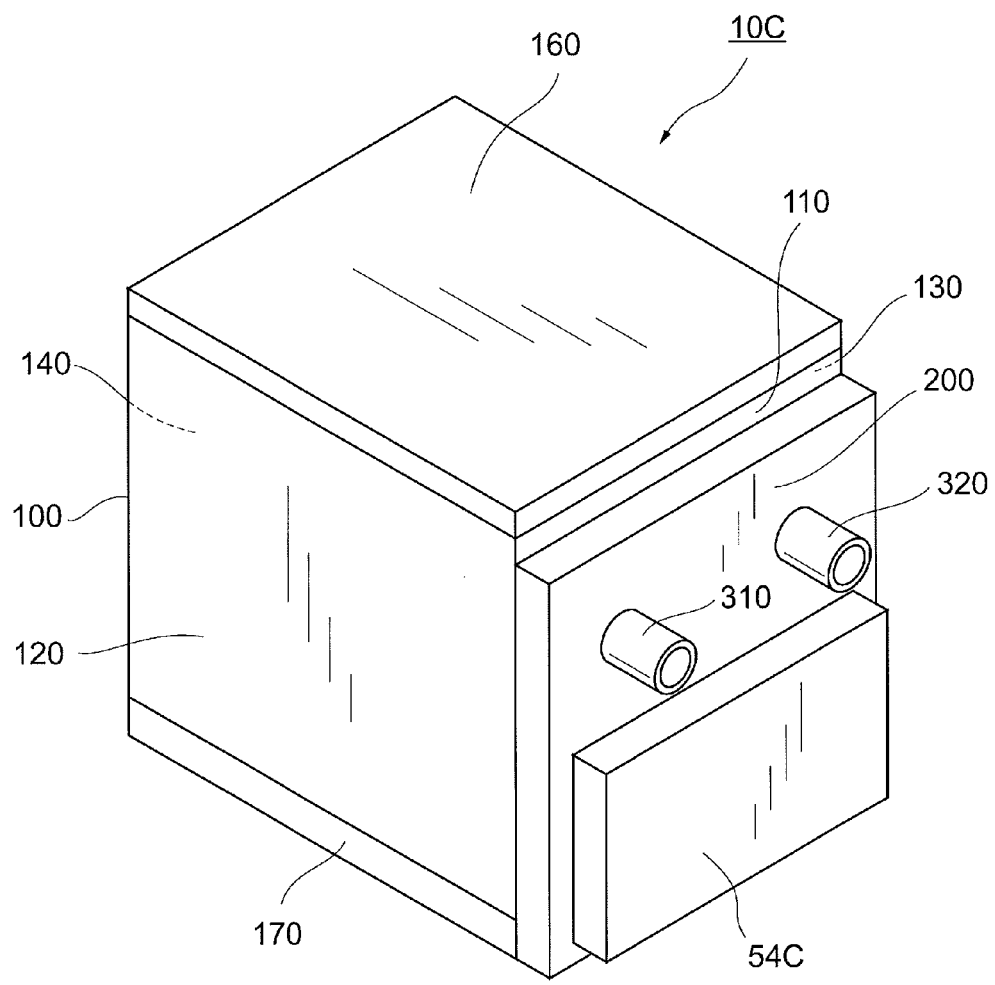
FIG. 12 shows a perspective view of an overall structure of an electric power converter according to a fourth embodiment of the present invention.

Next, an electric power converter 10C according to a fourth embodiment of the present invention will be described with reference to FIG. 12. Although the electric power converter 10C is different from the electric power converter 10 in that it includes a converter circuit section 54C, other configurations are the same as the electric power converter 10.

The converter circuit section 54C forms a part of the electric power conversion circuit 50, and is a circuit unit composed of a group of components for adding the function of the DC-DC converter to the electric power converter 10. As shown in FIG. 12, the converter circuit section 54C is fixed in a state of being contact with the major surface in the +x direction side of the connecting plate 200.

Figure 6:
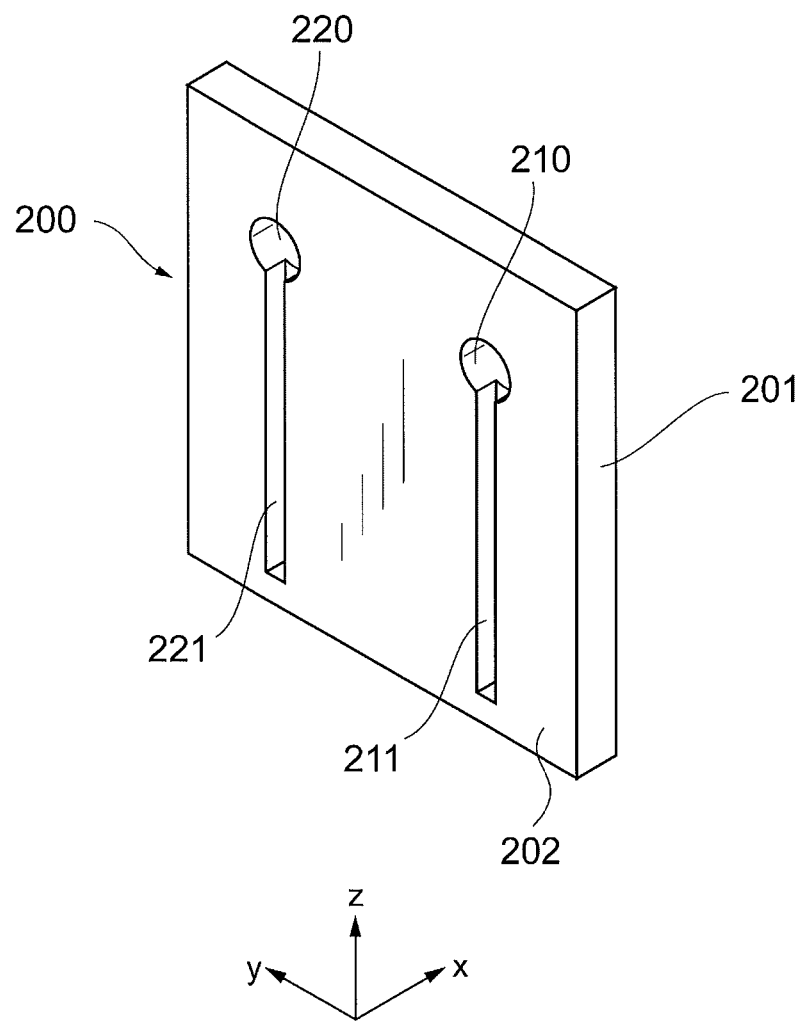
FIG. 6 shows a perspective view of a connecting plate of the electric power converter shown in FIG. 1.

According to such a configuration, the converter circuit section 54C is also cooled by the heat exchange with the cooling water passing through the groove 211 and the groove 221 (refer to FIG. 6). That is, in the present embodiment, a lower side space of the feed tube 310 and the discharge tube 320 is not a dead space, but is effectively used as a space for disposing the converter circuit section 54C. Further, it is possible also to cool the converter circuit section 54C by the connecting plate 200 without separately providing a cooling device.

In the foregoing description, an example that a distance between the inlet and the outlet of the cooling water in the flow passage FP1 (a distance between the central axis of the first end connecting tube 64 and the central axis of the second end connecting tube 65) and a distance between the inlet and the outlet of the cooling water in the flow passage FP2 (a distance between the central axis of the groove 173 and the central axis of the groove 175) are the same to each other is described. However, as an aspect of the present invention, it is not limited to such an example.

Figure 13:
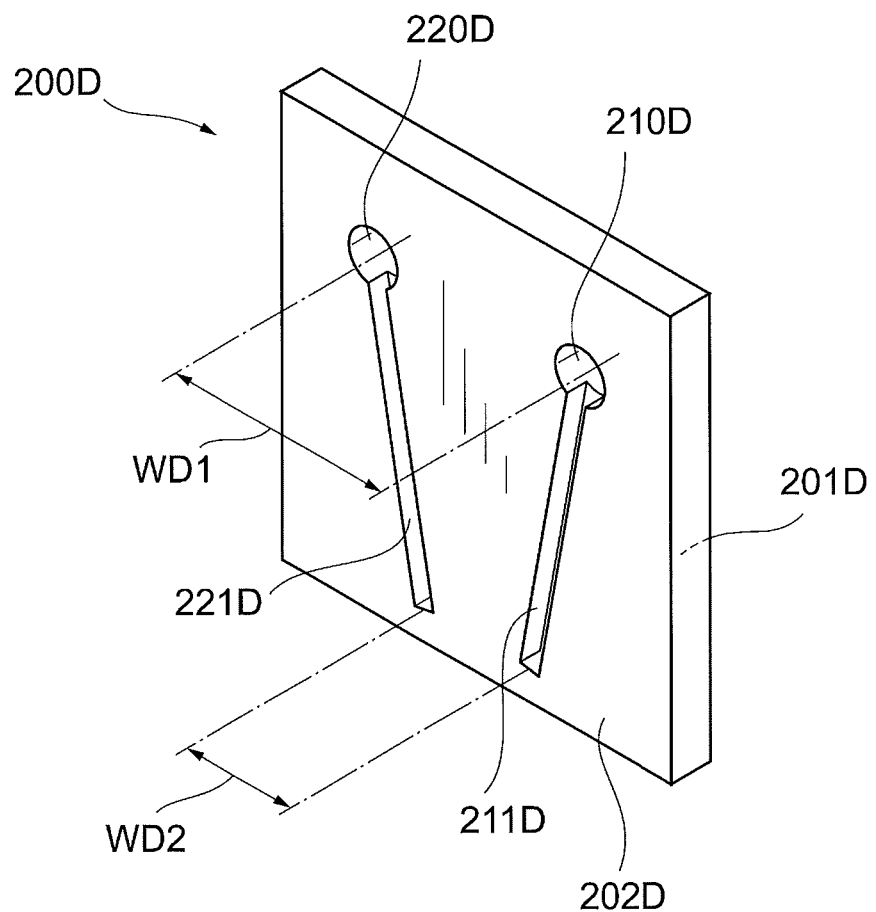
FIG. 13 shows a perspective view of a connecting plate of an electric power converter according to a fifth embodiment of the present invention.

FIG. 13 shows a connecting plate 200D of an electric power converter 10D according to a fifth embodiment of the present invention. In the electric power converter 10D, a distance WD2 between the central axis of the groove 173 and the central axis of the groove 175 is shorter than a distance WD1 between the central axis of the first end connecting tube 64 and the central axis of the second end connecting tube 65.

Therefore, a groove 211D that connects the first end connecting tube 64 (the inlet of the flow passage FP1) with the groove 173 (the inlet of the flow passage FP2) is not along the z-axis in the present embodiment, but it is formed so as to extend obliquely downward. In addition, a groove 211D that connects the second end connecting tube 65 (the outlet of the flow passage FP1) with the groove 175 (the outlet of the flow passage FP2) is also not along the z-axis in the present embodiment, but again it is formed so as to extend obliquely downward. A distance between a lower end of the groove 211D and a lower end of the groove 221D is equal to the distance WD2 between the central axis of the groove 173 and the central axis of the groove 175. As a result, the flow passage FP1 and the flow passage FP2 are communicated by the groove 211D as well as the flow passage FP1 and the flow passage FP2 are communicated by the groove 221D.

Thus, the present invention is not intended to limit its application by the difference between a form of the flow passage FP1 and a form of the flow passage FP2. As in the present embodiment, even when the distances (WD1, WD2) between the inlet and the outlet of the cooling water are different from each other, it is possible to communicate between the flow passage FP1 and the flow passage FP2 by the grooves 211D, 221D formed in the connecting plate 200D.

In the electric power converter 10 described above, the central axis of the feed tube 310 and the central axis of the first end connecting tube 64 are coincident with each other. As a result, a position where the groove 211 and the flow passage FP1 are connected is coincident with a position where the connecting plate 200 and the feed tube 310 are connected when viewed along the x-axis. Similarly, in the electric power converter 10, the central axis of the discharge tube 320 and the central axis of the second end connecting tube 65 are coincident with each other. As a result, a position where the groove 221 and the flow passage FP1 are connected is coincident with a position where the connecting plate 200 and the discharge tube 320 are connected when viewed along the x-axis.

However, embodiments of the present invention are not limited to aspects as described above. Respective positions of the feed tube 310 and discharge tube 320 projecting from the connecting plate 200 toward the +x direction can be set freely without being restricted by the positions and shapes of the groove 211, the groove 211, or the like.

Figure 14:
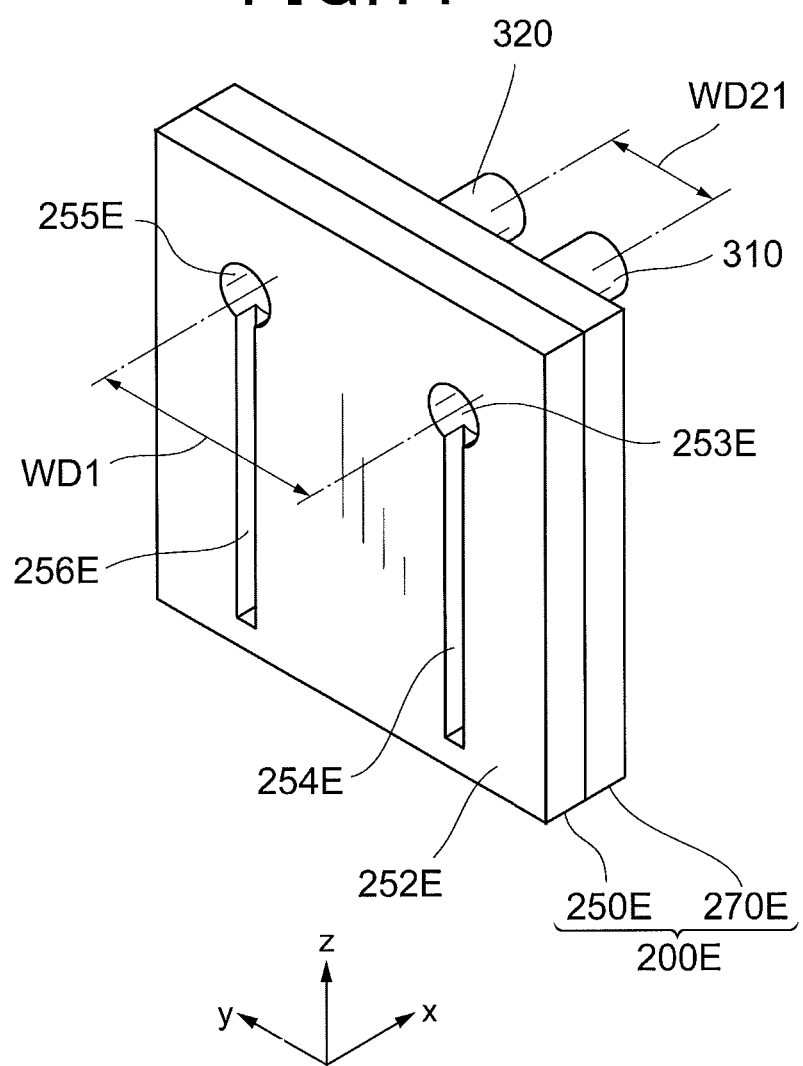
FIG. 14 shows a perspective view of a connecting plate of an electric power converter according to a sixth embodiment of the present invention.
Figure 15:
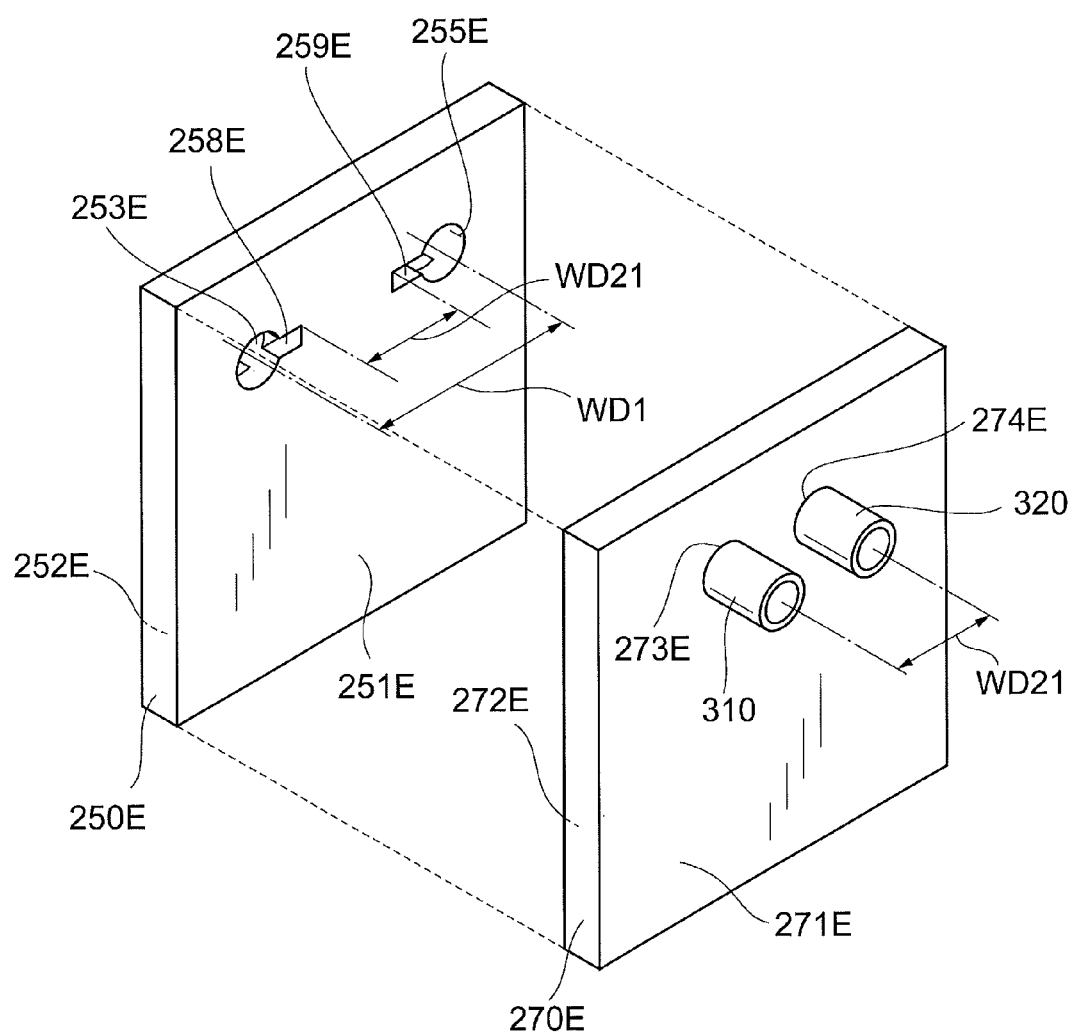
FIG. 15 shows an exploded view of the electric power converter according to the sixth embodiment of the present invention for describing a configuration of the connecting plate.

FIGS. 14 and 15 show a connecting plate 200E of the electric power converter 10E according to a sixth embodiment of the present invention. In the electric power converter 10E, a distance WD21 between the central axis of the feed tube 310 and the central axis of the discharge tube 320 is shorter than a distance WD1 between the central axis of the first end connecting tube 64 and the central axis of the second end connecting tube 65.

The connecting plate 200E is provided with a first connecting plate 250E and a second connecting plate 270E, and it has a structure that they are overlapped so that major surfaces thereof contact each other.

The first connecting plate 250E is a plate disposed on the case 100 side. The first connecting plate 250E is fixed in a state where a surface 252E, which is a major surface thereof in the −x direction side, is abutted against the side wall 110. A surface 251E, which is a major surface of the first connecting plate 250E in the +x direction side, is a surface where the second connecting plate 270E abuts.

The second connecting plate 270E is fixed in a state where a surface 272E, which is a major surface thereof in the −x direction side, is abutted against the surface 251E of the first connecting plate 250E. The feed tube 310 and the discharge tube 320 are protruded toward the +x direction from a surface 271E which is a major surface of the second connecting plate 270E in the +x direction side.

A through hole 273E to which the feed tube 310 is inserted into and a through hole 274E to which the discharge tube 320 is inserted into are formed in the second connecting plate 270E. Between an outer surface of the feed tube 310 and an inner surface of the through hole 273E are sealed watertight. Further, between an outer surface of the discharge tube 320 and an inner surface of the through hole 274E are sealed watertight.

A position where the through hole 273E is formed is in a position shifted in the +y direction side than a position where the first through hole 210 is formed in the connecting plate 200. Further, a position where the through hole 274E is formed is in a position shifted in the −y direction side than a position where the second through hole 220 is formed in the connecting plate 200. Thus, in the present embodiment, the distance WD21 between the central axis of the feed tube 310 and the central axis of the discharge tube 320 is shorter than the distance WD1 between the central axis of the first end connecting tube 64 and the central axis of the second end connecting tube 65.

A through hole 253E and a through hole 255E are formed in the first connecting plate 250E. The through hole 253E is formed in a position where a central axis thereof substantially coincides with the central axis of the first end connecting tube 64. The through hole 255E is formed in a position where a central axis thereof substantially coincides with the central axis of the second end connecting tube 65.

A groove 254E and a groove 256E extending along the z-axis are formed on the surface 252E of the first connecting plate 250E. Shapes of the groove 254E and the groove 256E are the same as the shapes of the groove 211 and the groove 221 formed in the connecting plate 200 of the electric power converter 10 (refer to FIG. 6).

A groove 258E and a groove 259E extending along the y-axis are formed on the surface 251E of the first connecting plate 250E. An end portion of the groove 258E in the −y direction side is communicated with the through hole 253E. An end portion of the groove 258E in the +y direction is in a position where the central axis of the through hole 273E passes. An end portion of the groove 259E in the +y direction side is communicated with the through hole 255E. An end portion of the groove 259E in the −y direction side is in a position where the central axis of the through hole 274E passes.

With such a configuration, the internal space of the feed tube 310 is communicated with the through hole 253E by the groove 258E. In addition, the internal space of the discharge tube 320 is communicated with the through hole 255E by the groove 259E. Therefore, a part of the cooling water supplied from the feed tube 310 reaches the through hole 255E passing through the flow passage FP1 after reaching to the through hole 253E passing through the grooves 258E. Other parts of the cooling water reach the through hole 255E passing through the groove 254E, the flow passage FP2, and the groove 256E sequentially.

Both the cooling water that has passed through the flow passage FP1 and the cooling water that has passed through the flow passage FP2 reach the through hole 255E and are merged. Then, the cooling water reaches the through hole 274E passing through the groove 259E, and returns to the radiator from the discharge tube 320.

Thus, positions of the feed tube 310 and discharge tube 320 projecting from the electric power converter 10E are not intended to be limited in any way by the form of the flow passage FP1. It is possible to connect the feed tube 310A to any position different from the position where the groove 254E and the flow passage FP1 are connected, or the position where the groove 256E and the flow passage FP2 are connected.

Similarly, it is possible to connect the discharge tube 320 to any position different from the position where the groove 254E and the flow passage FP1 are connected, or the position where the grooves 256E and the flow passage FP2 are connected.

Thus, the positions of the feed tube 310 and the discharge tube 320 can be freely set without depending on the form of the flow passage FP1 or the like. Therefore, when installing the electric power converter 10E into the electric vehicle, no connection of tubes to the surrounding equipment becomes the installation restrictions.

In the foregoing description, an example of a configuration in which the feed tube 310 and the discharge tube 320 are projecting from the connecting plate 200 in the same direction is described. However, as an aspect of the present invention, it is not limited to such. For example, as an electric power converter 10F in a seventh embodiment of the present invention (refer to FIG. 16), a discharge tube 320F may be configured to project toward the −x direction from the side wall 140.

Figure 16:
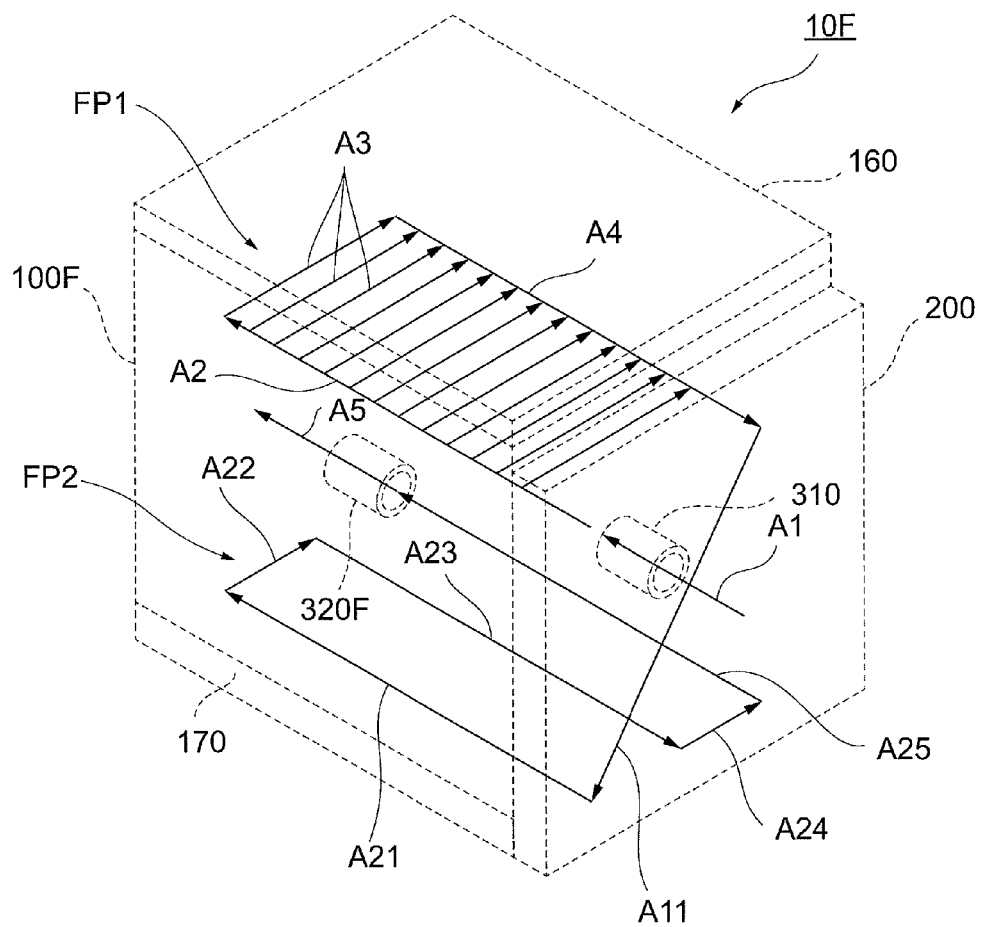
FIG. 16 shows a diagram of a flow of cooling water in an electric power converter according to a seventh embodiment of the present invention.

In this case, the flow passage FP2 is not a flow passage having the bracket ([) shape indicated by the arrow A21, the arrow A22, and the arrow A23 in FIG. 4, but may be a flow passage having, for example, substantially an S-shape indicated by an arrow A21, an arrow A22, an arrow A23, an arrows A24, and an arrow A25 in FIG. 16.

In the foregoing description, an example that both the grooves 211 and 221 for communicating the flow passage FP1 and the flow passage FP2 are not formed in the side wall 110 but in the connecting plate 200 side is described. In addition, an example that all the groove 173, the groove 174, and the groove 175 that constitute the flow passage FP2 are not formed in the bottom wall 150 but in the bottom cover 170 side is described. However, as an aspect of the present invention, it is not limited to such.

Figure 17:
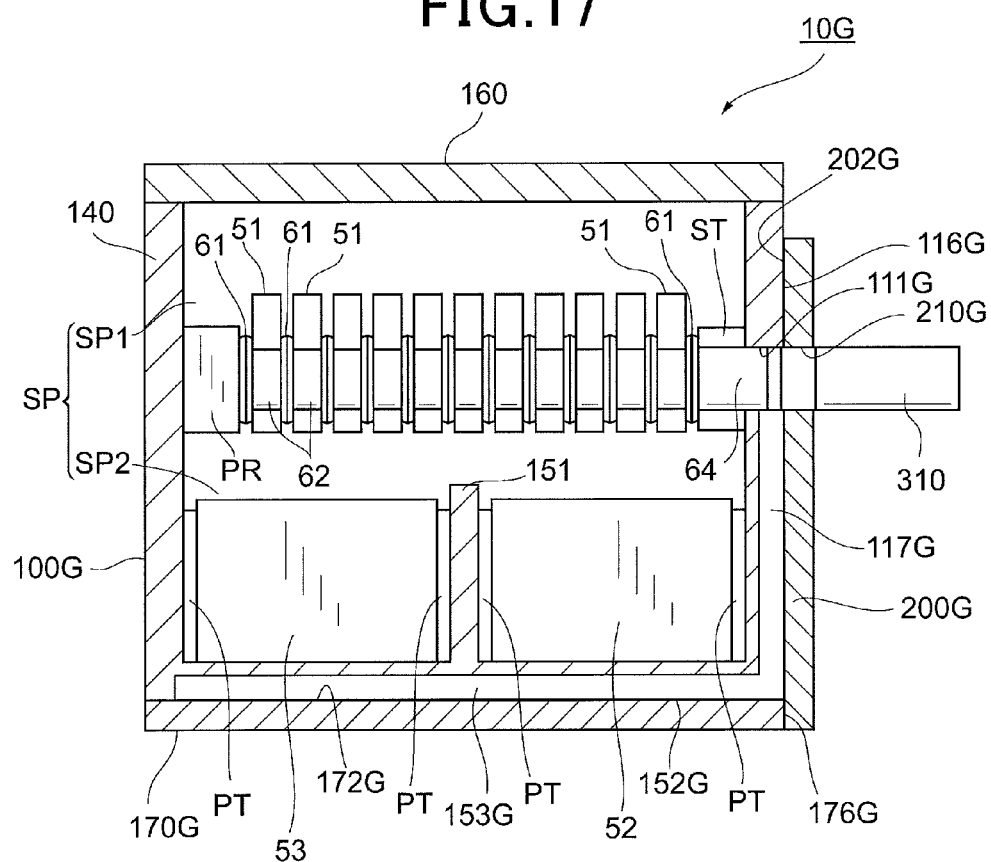
FIG. 17 shows a schematic diagram of an internal configuration of an electric power converter according to an eighth embodiment of the present invention.

FIG. 17 shows an electric power converter 10G according to an eighth embodiment of the present invention. In the electric power converter 10G, neither groove 211 nor groove 221 is formed on a surface 202G of a connecting plate 200G. Instead, the first end connecting tube 64 (the flow passage FP1) and an inlet of the flow passage FP2 (a groove 153G mentioned later) are communicated with each other by a groove 117G that is formed on a surface 116G of a side wall 110G. Similarly, the second end connecting tube 65 (the flow passage FP1) and an inlet of the flow passage FP2 (a groove 155G mentioned later, not shown) are communicated with each other by a groove 118G (not shown) that is formed on a surface of a side wall 110G.

The groove 173, the groove 174, and the groove 175 are not formed on an upper surface 172G of a bottom cover 170G. Instead, the flow passage FP2 having a shape of a bracket ([) when viewed from the above is formed by a groove 153G, a groove 154G (not shown), and a groove 155G (not shown) that are formed on a lower surface 152G of the bottom wall 150. Note that a shape formed by the groove 153G, the groove 154G, and the groove 155G when viewed from the above is the same as the shape formed by the groove 173, the groove 174, and the groove 175 in the electric power converter 10 (refer to FIG. 5).

Only a part of the flow passage (the connecting passage) that communicate the flow passage FP1 and the flow passage FP2 is necessary to be defined by the connecting plate 200G, and even in a case like the present embodiment that three sides of the connecting passage are defined by the case 100G (the side wall 110G) and only single side is defined by the connecting plate 200G, since the connecting passage is formed by the connecting plate 200G, it is included in the embodiments of the present invention.

Furthermore, the whole connecting passage may be formed inside the connecting plate in the present invention. In other words, all of the four sides around the connecting passage may be defined by the connecting plate.

The embodiments of the present invention have been described with reference to specific examples. However, the invention is not limited to these specific examples. That is, even if an appropriate modification is added to these specific examples by those of ordinary skill in the art, it is within the scope of the present invention as long as it has the features of the present invention. For example, elements and their arrangements, materials, conditions, shapes, sizes, etc. included in the specific examples described above are not limited to those exemplified, but can be appropriately changed. Moreover, the elements included in the respective embodiments described above can be combined as long as technically possible, and combinations of these can also fall within the scope of present the invention as long as they include the features of the present invention.

What is claimed is:

1. An electric power converter comprising:
    a case having a housing space formed therein;
    a first circuit section, which is a part of an electric power conversion circuit, disposed in an upper space of the housing space, the first circuit section being formed by alternately stacking a plurality of semiconductor modules and a plurality of cooling tubes, both ends of the plurality of cooling tubes being respectively connected by first connecting tubes and second connecting tubes;
    a second circuit section, which is another part of the electric power converter circuit, disposed in a lower space of the housing space;
    a first flow passage formed so that a fluid passes through while exchanging heat with the first circuit section, the first flow passage comprised of the first connecting tubes, the second connecting tubes, and the plurality of cooling tubes;
    a second flow passage formed so that the fluid passes through while exchanging heat with the second circuit section; and
    a plate-like connecting plate attached in a state where a major surface thereof is disposed along a side wall of the case; wherein,
    connecting passages that communicate between the first flow passage and the second flow passage are formed in the connecting plate.

2. The electric power converter according to claim 1, wherein,
    the connecting passages include:
    a first connecting passage where the fluid passes through towards one of the first flow passage or the second flow passage; and
    a second connecting passage where the fluid that has passed through the first connecting passage and further passed through either the first flow passage or the second flow passage passes through; wherein,
    the second connecting passage is formed at a position farther than the first connecting passage is when viewed from the case side.

3. The electric power converter according to claim 1, wherein,
    the electric power converter circuit further includes a third circuit section in addition to the first circuit section and the second circuit section; and
    the third circuit section is mounted on a major surface of the connecting plates, and the major surface is disposed in a side opposite to a side where the case is disposed.

4. The electric power converter according to claim 1, wherein,
    the connecting passages include:
    a first connecting passage where the fluid passes through towards one of the first flow passage or the second flow passage; and
    a second connecting passage where the fluid that has passed through the first connecting passage and further passed through either the first flow passage or the second flow passage passes through; wherein,
    the electric power converter further includes a feed tube for supplying the fluid to the connecting plate from outside of the case, one end portion of the feed tube being connected to the connecting plate; and
    when viewed along a normal direction of the major surface of the connecting plate,
    both a position where the first connecting passage and the first flow passage are connected and a position where the second connecting passage and the second flow passage are connected are different from a position where the connecting plate and the feed tube are connected.

5. The electric power converter according to claim 1, wherein,
    the connecting passages include:
    a first connecting passage where the fluid passes through towards one of the first flow passage or the second flow passage; and
    a second connecting passage where the fluid that has passed through the first connecting passage and further passed through either the first flow passage or the second flow passage passes through; wherein,
    the electric power converter further includes a discharge tube (320) for discharging the fluid from the connecting plate to outside of the case, one end portion of the discharge tube is connected to the connecting plate; and
    when viewed along a normal direction of the major surface of the connecting plate,
    both a position where the first connecting passage and the first flow passage are connected and a position where the second connecting passage and the second flow passage are connected are different from a position where the connecting plate and the discharge tube are connected.

6. The electric power converter according to claim 1, wherein,
    at least one of the first circuit section and the second circuit section is fixed in a state where potting resin is interposed between inner wall surfaces of the case, and it is configured so that heat exchange is also performed between the fluid passing through the connecting passages and at least one of the first circuit section and the second circuit section.

* * * * *